United States Patent
Liu et al.

(10) Patent No.: US 9,398,727 B2
(45) Date of Patent: Jul. 19, 2016

(54) SERVER ASSEMBLY

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Lei Liu, Shenzhen (CN); Guo-Yi Chen, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 93 days.

(21) Appl. No.: 14/471,725

(22) Filed: Aug. 28, 2014

(65) Prior Publication Data
US 2015/0189795 A1    Jul. 2, 2015

(30) Foreign Application Priority Data
Jan. 2, 2014    (CN) .......................... 2014 1 00006826

(51) Int. Cl.
*G06F 1/20* (2006.01)
*H05K 5/00* (2006.01)
*H05K 7/20* (2006.01)

(52) U.S. Cl.
CPC .................................. *H05K 7/20727* (2013.01)

(58) Field of Classification Search
CPC .......... H05K 7/20718; H05K 7/20727; H05K 7/20145
USPC ........................................ 361/679.46–679.54
See application file for complete search history.

(56) References Cited

U.S. PATENT DOCUMENTS

| | | | | |
|---|---|---|---|---|
| 5,559,673 A | * | 9/1996 | Gagnon | G06F 1/20 165/122 |
| 2003/0002253 A1 | * | 1/2003 | Hillyard | G06F 1/16 361/679.48 |
| 2004/0218357 A1 | * | 11/2004 | Shih | H05K 7/20727 361/695 |
| 2005/0068722 A1 | * | 3/2005 | Wei | H05K 7/20736 361/679.48 |
| 2010/0321874 A1 | * | 12/2010 | Bhattacharyya | H05K 7/20736 361/679.5 |
| 2011/0122573 A1 | * | 5/2011 | Peng | G06F 1/20 361/679.48 |
| 2011/0299240 A1 | * | 12/2011 | Kimura | H05K 7/20727 361/679.49 |
| 2015/0173250 A1 | * | 6/2015 | Tang | H05K 7/20727 361/679.49 |
| 2015/0373881 A1 | * | 12/2015 | Ross | H05K 7/20727 361/679.51 |

* cited by examiner

*Primary Examiner* — Anthony Haughton
*Assistant Examiner* — Yahya Ahmad
(74) *Attorney, Agent, or Firm* — ScienBiziP, P.C.

(57) ABSTRACT

A server assembly includes a first server and a second server sharing the cooling provided by one or more fans. The first server is stacked on the second server. The first server includes a first bottom plate having vents, a first side plate having first air inlets, and a first back plate having air outlets. The fans are mounted to the first server. The second server includes a second bottom plate, a second side plate having second air inlets, and a second back plate. The servers are configured to dissipate heat from the first server by air that enters the first server and is expelled out of the air outlets by the fans, and to dissipate heat from the second server by air that enters the second server, enters the first server from the vents, and is expelled out of the air outlets by the fans.

5 Claims, 3 Drawing Sheets

SERVER ASSEMBLY

FIELD

The present disclosure relates to a server assembly.

BACKGROUND

In large data center or computer room, more fans are mounted for cooling as the number of servers increases and power consumption is increased.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
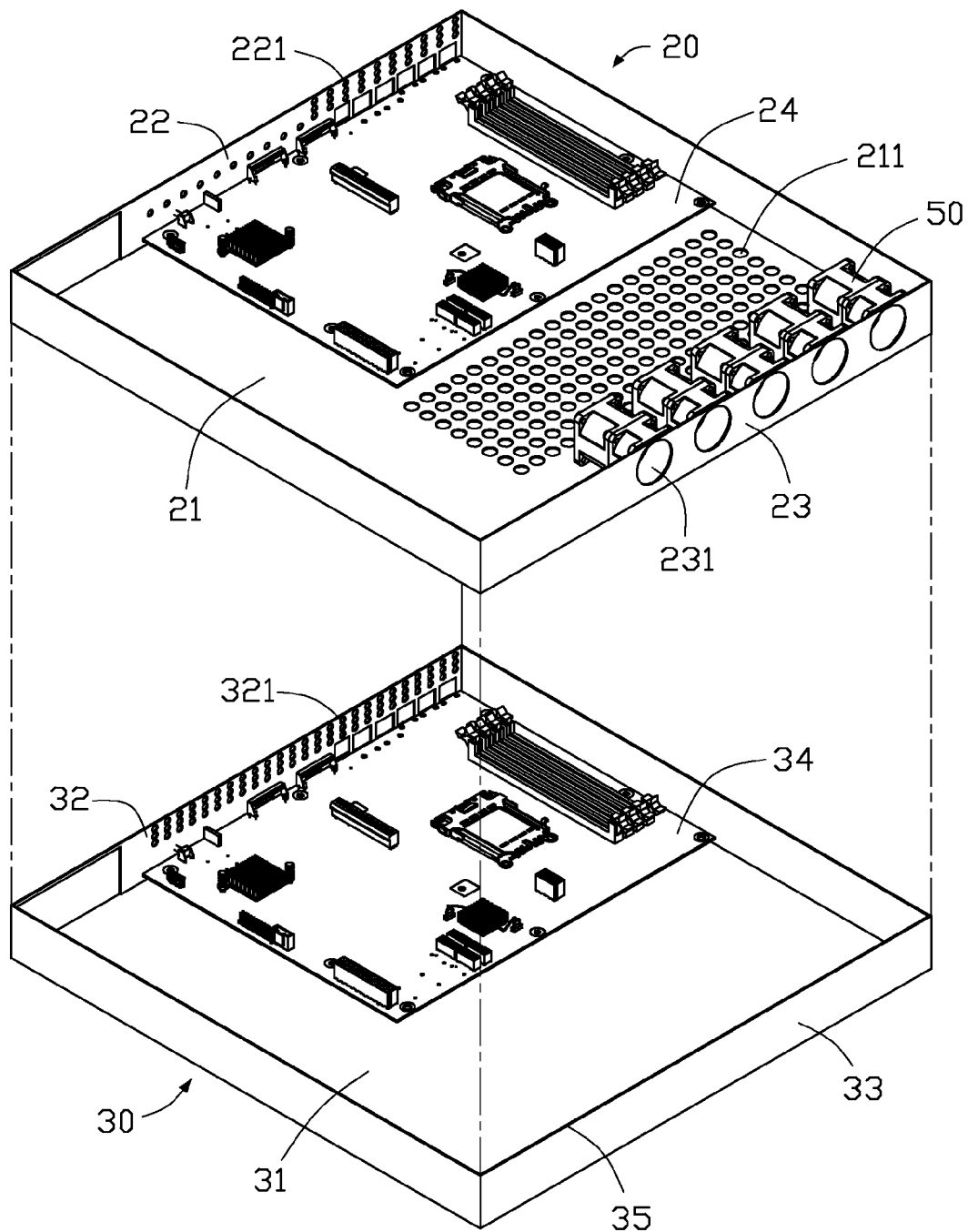
FIG. 1 is an exploded, isometric view of an exemplary embodiment of a server assembly.
Figure 2:
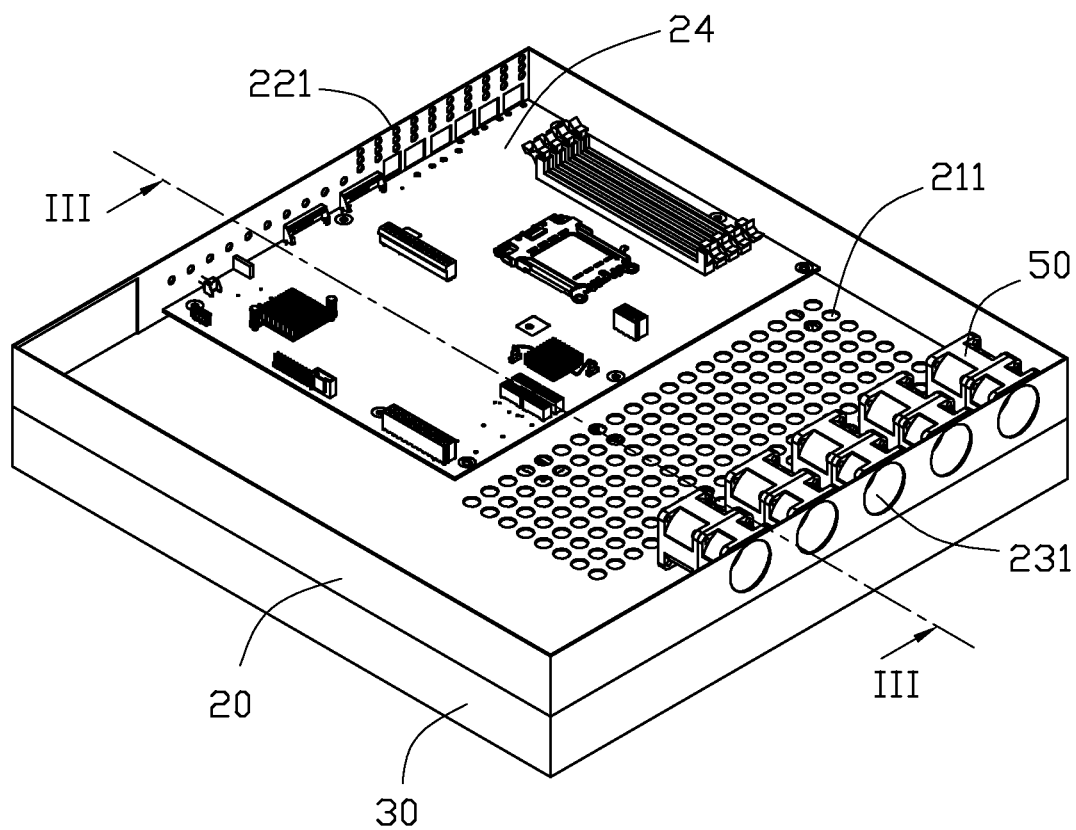
FIG. 2 is an assembled, isometric view of the server assembly of FIG. 1.

FIGS. 1 and 2 show an exemplary embodiment of a server assembly. The server assembly can comprise a first server 20 and a second server 30. The first server 20 is stacked on the top of the second server 30.

The first server 20 can comprise a first bottom plate 21, a first side plate 22 vertically extending up from one side of the first bottom plate 21, a first back plate 23 extending up from an opposite side of the first bottom plate 21, and a first motherboard 24 mounted on the first bottom plate 21 close to the first side plate 22. The first side plate 22 defines a plurality of first air inlets 221 and the first back plate 23 defines a plurality of air outlets 231. A plurality of fans 50 are mounted into the first server 20 close to the first back plate 23. Air outlets of the fans 50 face the air outlets 231 of the first back 23. The first bottom plate 21 defines a plurality of vents 211 between the first motherboard 24 and the fans 50.

The second server 30 can comprise a second bottom plate 31, a second side plate 32 vertically extending up from one side of the second bottom plate 31, a second back plate 33 extending up from an opposite side of the second bottom plate 31, and a second motherboard 24 mounted on the second bottom plate 31 close to the second side plate 32. A top of the second server 30 defines an opening 35. The second side plate 32 defines a plurality of second air inlets 321. No holes are defined in the second bottom plate 31 and the second back plate 33.

Figure 3:
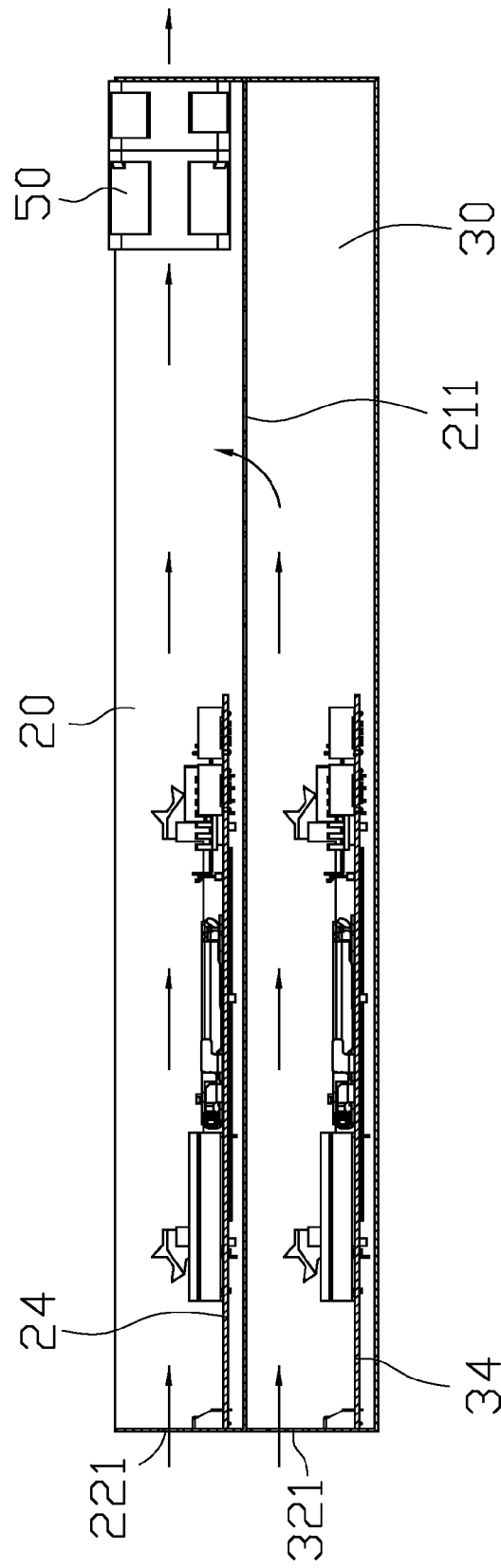
FIG. 3 is a cross-sectional view taken along line III-III of FIG. 2.

FIG. 3 illustrates an assembly, in which the first server 20 is stacked on the second server 30, and the opening 35 on the top of the second server 30 communicates with the vents 211 of the first server 20. The servers are configured to dissipate heat from the electronic components on the first motherboard 24 of the first server 20 by air that enters the first server 20 from the first air inlets 221 and is expelled out of the air outlets 231 by the fans 50, and to dissipate heat from the electronic components on the second motherboard 34 of the second server 30 by air that enters the second server 30 from the second air inlets 321, enters the first server 20 from the vents 211, and is expelled out of the air outlets 231 by the fans 50. Therefore, the first server 20 and the second server 30 share one or more fans 50, so that the number of the fans and the power consumption are reduced.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A server assembly, comprising:
a first server comprising a first bottom plate, a first side plate extending up from one side of the first bottom plate and a first back plate extending up from an opposite side of the first bottom plate, the first side plate defining a plurality of first air inlets, the first back plate defining a plurality of air outlets, the first bottom plate defining a plurality of vents, the first server defining a plurality of fans close to the first back plate in the first server; and
a second server comprising a second bottom plate, a second side plate extending up from one side of the second bottom plate and a second back plate extending up from an opposite side of the second bottom plate, the second side plate defining a plurality of second air inlets, a top of the second server forming an opening communicated with the vents of the first bottom plate, the first bottom plate is received in the opening;
wherein the servers are configured to dissipate heat from the first server by air that enters the first server from the first air inlets and is expelled out of the air outlets by the fans, and to dissipate heat from the second server by air that enters the second server from the second air inlets, enters the first server from the vents, and is expelled out of the air outlets by the fans.

2. The server assembly of claim 1, wherein no holes are defined in the second bottom plate and the second back plate.

3. The server assembly of claim 1, further comprising a first motherboard mounted on the first bottom plate close to the first side plate to dissipate heat from the electronic components on the first motherboard by the air that enters the first server from the first air inlets and is expelled out of the air outlets by the fans.

4. The server assembly of claim 3, wherein the vents of the first bottom plate are located between the first motherboard and the fans.

5. The server assembly of claim 1, further comprising a second motherboard mounted on the second bottom plate close to the second side plate to dissipate heat from the electronic components on the second motherboard by the air that enters the second server from the second air inlets, enters the first server from the vents, and is expelled out of the air outlets by the fans.

* * * * *